United States Patent [19]

Eaton et al.

[11] Patent Number: 5,414,596
[45] Date of Patent: May 9, 1995

[54] PORTABLE ELECTRONIC DEVICE ATTACHMENT CLIP HOUSING A BATTERY

[75] Inventors: Eric T. Eaton; Charles W. Mooney, both of Lake Worth, Fla.

[73] Assignee: Motorola Inc., Schaumburg, Ill.

[21] Appl. No.: 131,352

[22] Filed: Oct. 4, 1993

[51] Int. Cl.6 .................. H04B 1/08; H01R 39/00; H01M 2/10; H05K 5/02
[52] U.S. Cl. .................. 361/814; 455/351; 439/31; 429/98
[58] Field of Search ............ 455/348, 351; 368/282, 368/281; 429/96–100; 439/18, 20, 23, 28, 31, 500; 361/679, 803, 814, 683

[56] References Cited

U.S. PATENT DOCUMENTS

| | | |
|---|---|---|
| 3,670,491 | 6/1972 | Weschler ............... 368/282 X |
| 4,536,925 | 8/1985 | Boothe et al. . |
| 4,828,153 | 5/1989 | Guzik et al. . |
| 5,081,709 | 1/1992 | Benyo et al. . |
| 5,293,300 | 3/1994 | Leung ................ 361/683 |

*Primary Examiner*—Michael W. Phillips
*Attorney, Agent, or Firm*—James A. Lamb

[57] ABSTRACT

A portable electronic device comprises a housing (100) including an attachment dip (110), electronic circuitry (215) enclosed within the housing, and an energy storage device (120) housed within the attachment clip.

11 Claims, 3 Drawing Sheets

PORTABLE ELECTRONIC DEVICE ATTACHMENT CLIP HOUSING A BATTERY

FIELD OF THE INVENTION

This invention relates in general to energy storage devices for portable electronic devices and in particular to the housing for the energy storage devices.

BACKGROUND OF THE INVENTION

Customers continue to request smaller and more functional portable electronic devices, such as broadcast radio receivers, compact disk players, and commercial selective radio receivers such as pagers and two way portable radios. As portable electronic devices have become smaller, a variety of carrying means have developed. These carrying means have included belt mounted carrying cases, which are particularly convenient for larger items that must be readily accessible, such as large portable two way radios, and attachment clips for smaller devices such as pagers. The marketplace continues to demonstrate that, for items such as pagers, with which the user interacts frequently during the day, there is a desire to carry the device conveniently attached to the user's wearing apparel, with the device providing as little bulk as possible so as to avoid interference with chairs, or with people in crowded circumstances, etc.

For the convenience of use expected with these types of portable electronic devices, the energy source must be carried with the device and is typically a stored energy device. Although substantially all portable electronic devices use batteries as their stored energy source, large capacitors are a conceivable viable alternative.

A problem with the stored energy devices in portable electronic devices is that, while the size of the electronics has continued to diminish, the energy storage devices are not shrinking as fast, and therefore they occupy a larger percentage of the volume required. Thus, the incorporation of the storage device within the same housing which contains other major functional portions of the device restricts the flexibility of positioning the other major functional portions, impacting the housing size and the portable electronic device's cost. For example, the relatively large bulk of the battery in a selective call receiver typically dictates that the antenna be placed at the opposite end of the device. This requirement complicates the placement of an alphanumeric display which can increase the cost and size of the device because the display typically has complicated interconnections to the controller portion of such a device.

In addition, the inclusion of the energy storage device within the housing of a portable electronic device makes the design of a housing which will protect the electronics from water difficult to achieve. Typically a device such as a pager can be made water resistant but not submersible because of the need for a battery door.

Thus, what is needed is a means to reduce the bulkiness of portable electronic devices designed for attachment to the user's wearing apparel, while at the same time providing improved water protection for the electronic circuitry.

SUMMARY OF THE INVENTION

Accordingly, in a preferred embodiment of the present invention, a portable electronic device comprises a housing including an attachment clip, electronic circuitry enclosed within the housing, and an energy storage device housed within the attachment clip.

DETAILED DESCRIPTION OF THE INVENTION

Figure 1:
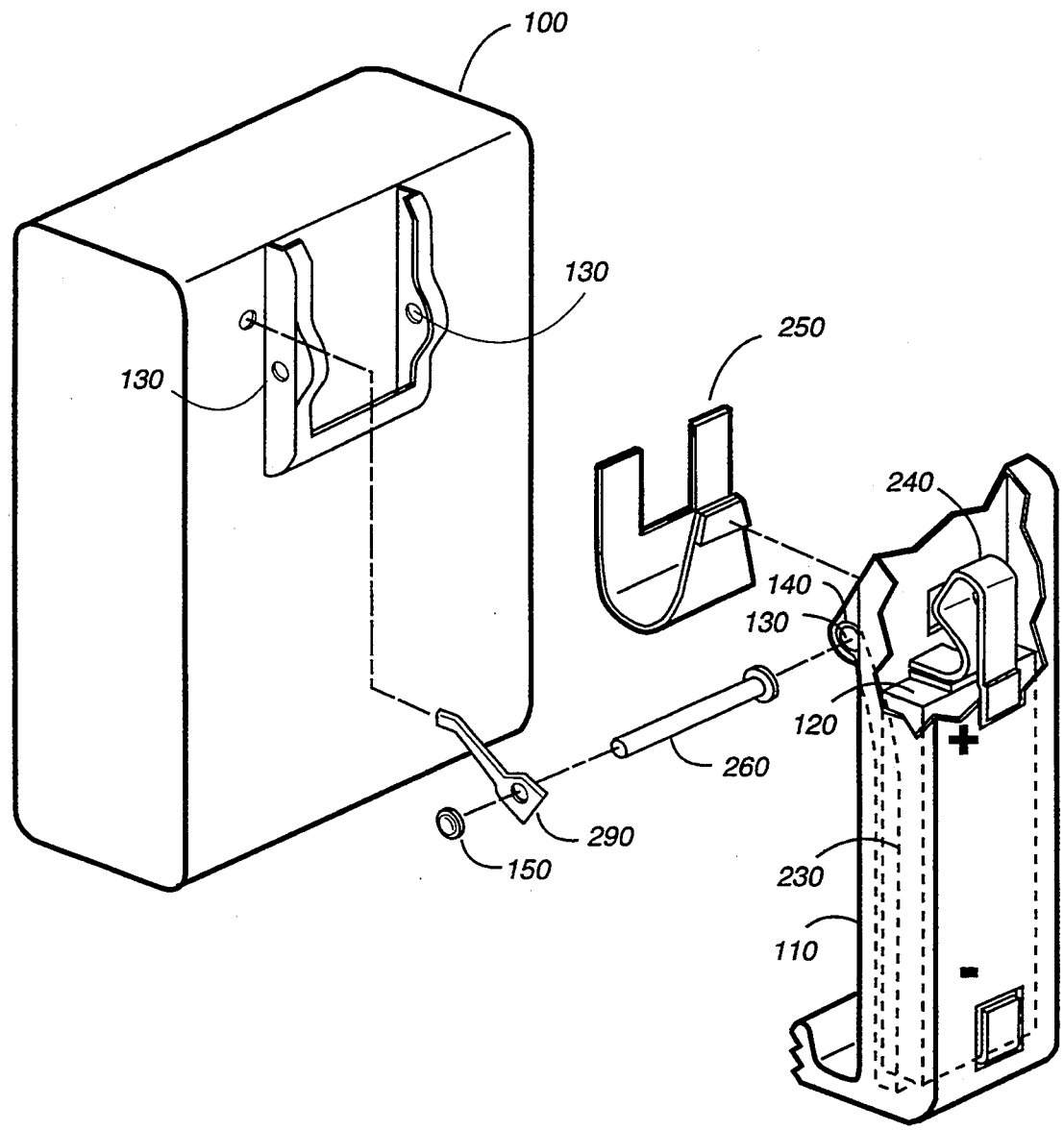
FIG. 1 is a mechanical diagram showing an exploded view of an attachment clip coupled to a housing of a portable electronic device, in accordance with the preferred embodiment of the present invention.
Figure 2:
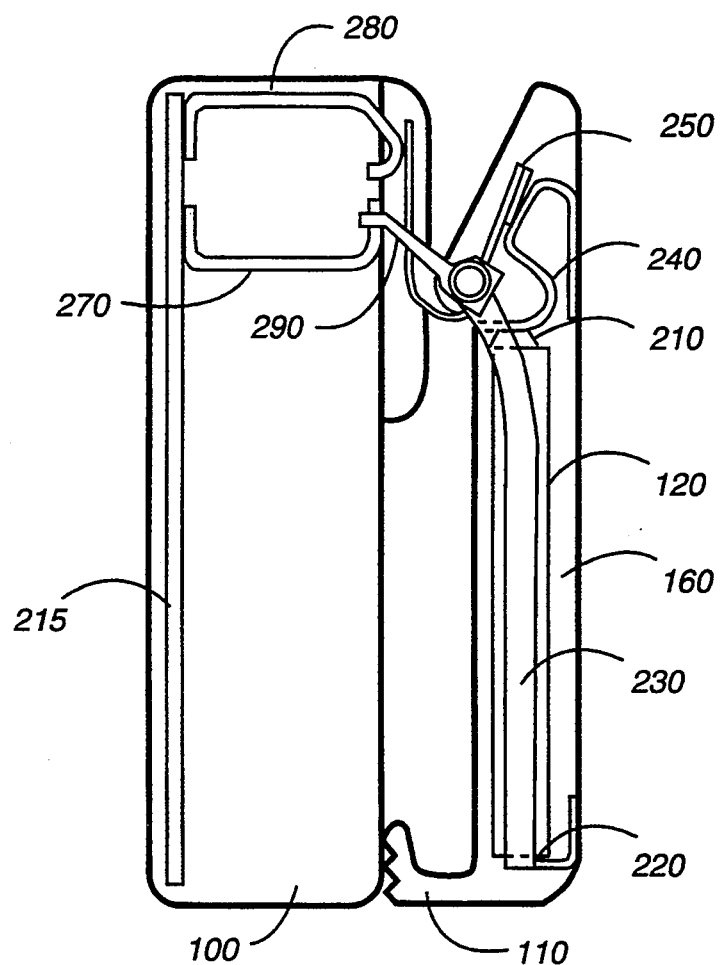
FIG. 2 is a mechanical diagram showing a side view of the attachment clip coupled to the housing of the portable electronic device, in accordance with the preferred embodiment of the present invention.

FIG. 1 and FIG. 2, respectively, show an exploded view and a side view of an attachment clip 110 coupled to a housing 100 of a portable electronic device 300, in accordance with the preferred embodiment of the present invention. The portable electronic device 300 comprises a housing 100, an attachment clip 110, a controller 215, a battery 120, and mechanical and electrical coupling parts comprising a negative clip conductor 230, a positive clip conductor 240, a hinge pin 260, a clip spring 250, a nut retainer 150, a pin to housing conductor 290, a negative housing conductor 270, and a positive housing conductor 280. In a manner well known to those skilled in the art, two hinge pin holes 130 (one shown in FIG. 1) are located in flanges on the attachment clip, and two additional hinge pin holes 130 (shown in FIG. 1) are located on flanges on the housing. The hinge pin 260 passes through the four hinge pin holes 130 to provide mechanical, rotational coupling of the attachment clip 110 to the housing 100, and the hinge pin 260 is retained by the nut retainer 150. The attachment clip 110 in the preferred embodiment of the present invention is a clip, well known as a belt clip to those skilled in the art, designed to attach the portable electronic device 300 conveniently at a user's belt, or to any flat material, for example, a flap of a purse or a flap in a briefcase, or a shirt pocket.

The battery 120, which is preferably a prismatic battery model KF-8400 made by Sanyo Energy Corporation of San Diego, Calif., comprises a negative electrode 220 and a positive electrode 210. The battery 120, in accordance with the preferred embodiment of the present invention, is housed in a cavity 160 inside the attachment clip 110 and supplies energy to the controller 215. The electrical energy is coupled in series from the positive electrode 210 of the battery 120 through the clip spring 250, through the positive housing conductor 280, to the controller 215 These series couplings form a low resistance electrical path from the positive electrode 210 of the battery 120 to the controller 215. A portion of the positive housing conductor 280 is on the outside of the housing 100 where an end of the clip spring is located. The clip spring 250 is also used as a mechanical coupling which maintains the pressure between the attachment clip 110 and the housing 100. It is retained by a slot feature on the housing 100, in a manner well known to those skilled in the art.

The negative electrode 220 of the battery 120 is electrically coupled to the negative clip conductor 230. The negative clip conductor 230 is routed to one of the hinge pin holes 130 where a portion of the negative attachment conductor 230 forms a negative contact plate 140. The pin to housing conductor 290 is pressed against and electrically coupled to the negative contact plate 140 by the nut retainer 150 on the hinge pin 260. The pin to housing conductor 290 is electrically coupled to the negative housing conductor 270 which is further electrically coupled to the controller 215 completing a negative conductive path from the battery 120 to the controller 215.

The controller 215, to which energy is coupled from the battery 120 by the means describe above, distributes a portion of the energy to other circuitry (not shown) of the portable electronic device 300

It will be appreciated that other electromechanical means of coupling the energy from the stored energy source in the attachment clip to the electronics within the housing are possible, and that the cavity in the attachment clip could be used solely for a spare energy storage device, in which case no electrical coupling would be necessary. Furthermore, it will be appreciated that the attachment clip 110 may be formed as an integral portion of a housing and clip part, by means such as injection molding, therefore having no additional mechanical coupling means, with the electrical coupling means being molded therein or conveyed in cavities within the integral housing and clip part. Furthermore, it will be appreciated that the battery 120 and attachment clip 110 could be mechanically integrated by molding the attachment clip 110 around the battery 120 and the clip electrical conductors 230 and 240, making an integral part comprising either a primary (non-rechargeable) battery in an attachment clip which could be replaceable, or comprising a secondary (re-chargeable) battery coupled to recharging contacts on a surface of the attachment clip 110 or on a surface of the housing 100.

Figure 3:
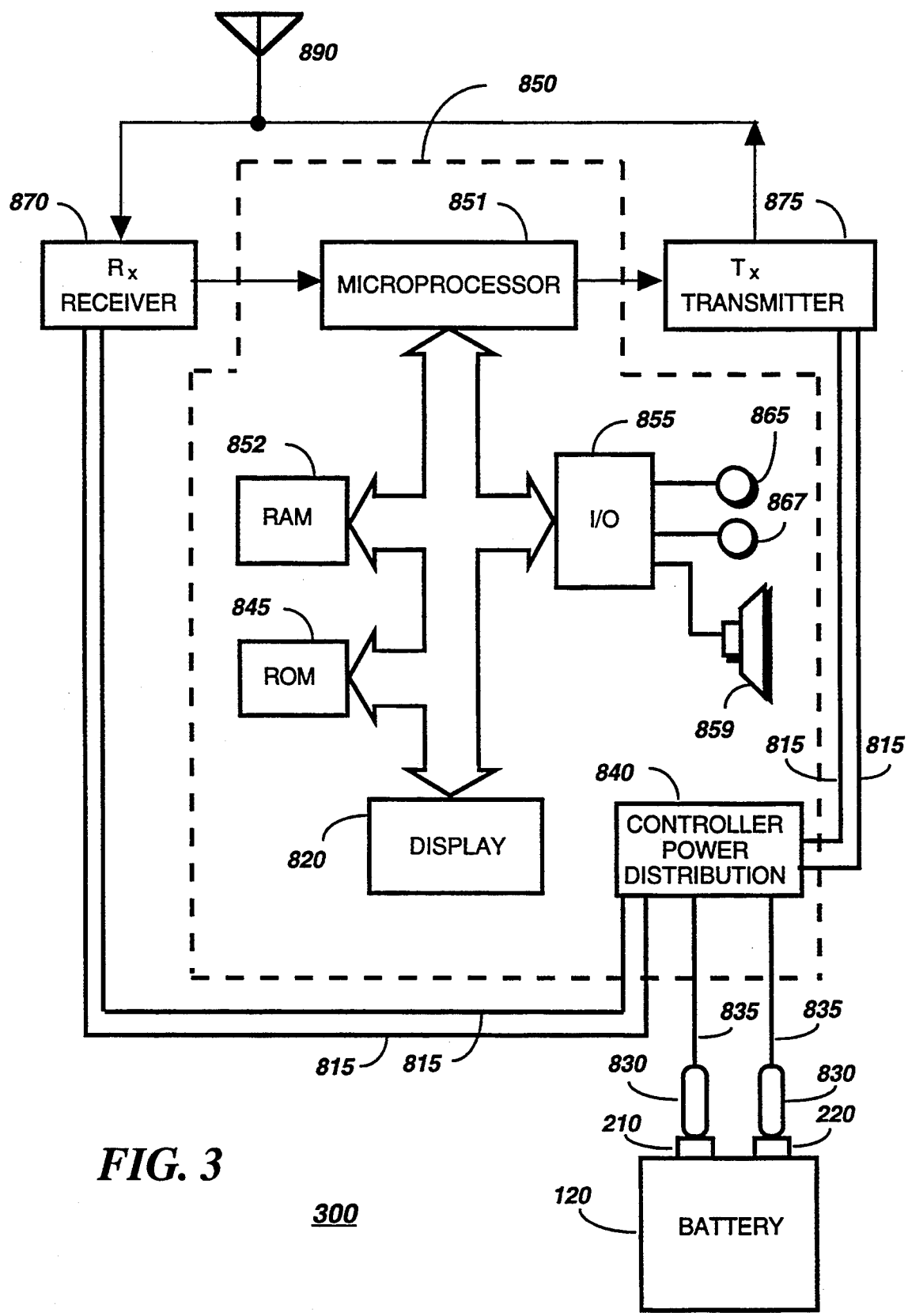
FIG. 3 is an electrical block diagram of a selective call receiver in accordance with the preferred embodiment of the present invention.

Referring to FIG. 3, an electrical block diagram is shown for a portable electronic device 300 which, in accordance with the preferred embodiment of the present invention, is a selective call device. The selective call device 300 comprises an antenna 890 which couples received radio frequency (RF) signals to a receiver 870 where they are processed to generate demodulated information to a controller 850. The controller 850 comprises a microprocessor 851, a random access memory (RAM) 852, an input output (I/O) 855, two operator controls 865 and 867, a read only memory (ROM) 845, a display 820, a speaker 859, two controller conductors 835, and a power distribution circuit 840. The microprocessor 851 stores the information in RAM 852 and further processes the information in accordance with programmed instructions stored in the ROM 845. When the microprocessor 851 determines that the address part of the message does not contain the address for selective call device 300, message processing ceases. When the microprocessor 851 determines that the address part of the message does contain the address of selective call device 300, the information part of the message is further processed. Depending on the content of the information part of the message and the settings of the controls 865 and 867, the microprocessor 851 will perform one or more of the following actions: couple information to the display 820, couple an alert signal to the speaker 859 through the I/O port 855, or generate an acknowledgment message which is coupled to an RF transmitter 875 which modulates the message, generating an RF signal which is coupled from the RF transmitter 875 to the antenna 890.

The selective call receiver further comprises the battery 120 which comprises the positive electrode 210 and negative electrode 220. The battery electrodes 210 and 220 are coupled by an electronic coupling means 830 to the controller conductors 835 which couple the energy to the controller power distribution circuit 840. In the preferred embodiment illustrated in FIG. 1 and FIG. 2, the electronic coupling means 830 comprise the negative clip conductor 230, the hinge pin 260, the nut retainer 150, the pin to housing conductor 290, the negative housing conductor 280, the positive clip conductor 240, the clip spring 250, and the positive housing conductor 270 The power distribution circuit 850 distributes power to the controller circuitry comprising the microprocessor 851, RAM 852, ROM 845, I/O 855, display 820, operator controls 865 and 867, and the speaker 859, as well as to the receiver 870 and to the transmitter 875, in a manner well known to those skilled in the art.

It should be appreciated that the power storage and distribution aspects of a selective call receiver are similar to those of other portable electronic devices.

It will be further appreciated that eliminating the battery from within the housing 100 eliminates a need for a removable battery door in the housing 100, which allows the housing 100 to be lower cost and more watertight than prior art housings having a quickly removable battery door. The increased water tightness inherently increases the reliability of electronics in the housing 100 by substantially reducing the intrusion of undesirable environmental contaminants, such as dirt and water. The battery itself has much better resistance to such contaminants.

Furthermore, the design of the housing 100 and the circuitry within the housing 100 is simplified and room for more functions within the housing 100 is provided by the removal of the bulky battery 120 and the elimination of the attendant battery location restrictions (such as easy removal). The design of portable electronic devices such as selective call receivers, which have antennas, is further simplified because antennas are significantly affected by the bulk of the battery, which is typically located farther away than in prior art designs where the battery is in the housing 100. These design simplifications are ultimately reflected in lower cost and quicker product availability.

By now it should be appreciated that there has been provided an apparatus which provides a means of locating an energy storage device within the attachment clip of a portable electronic device, thereby significantly improving the bulk of the device as perceived by the user, the reliability and water tightness of the device, and lower cost.

We claim:

1. A portable electronic device comprising:
 a housing including an attachment clip;
 electronic circuitry enclosed within the housing; and,
 an energy storage device housed within the attachment clip.

2. The portable electronic device according to claim 1 wherein said attachment clip is a belt clip.

3. The portable electronic device according to claim 1 wherein said energy storage device is a battery.

4. The portable electronic device according to claim 3 wherein said battery is a prismatic battery.

5. The portable electronic device according to claim 1 wherein said energy storage device is electrically coupled to said electronic circuitry.

6. The portable electronic device according to claim 1 wherein said energy storage device is a spare energy storage device for coupling to said electronic circuitry.

7. The portable electronic device according to claim 1 wherein the portable electronic device is a selective call receiver.

8. A portable electronic device comprising:
a housing including an attachment clip; and
electronic circuitry enclosed within the housing for coupling to an energy storage device, the attachment clip having a cavity formed therein for housing the energy storage device.

9. The portable electronic device according to claim 8 wherein said attachment clip is a belt clip.

10. The portable electronic device according to claim 8 wherein the portable electronic device is a selective call receiver.

11. The device according to claim 8 further comprising conductive means coupling said attachment clip to said housing, wherein said conductive means is for electrically coupling the energy storage device to said electronic circuitry.

* * * * *